United States Patent
Hara et al.

(10) Patent No.: US 9,024,311 B2
(45) Date of Patent: May 5, 2015

(54) THIN FILM TRANSISTOR, METHOD FOR MANUFACTURING SAME, ACTIVE MATRIX SUBSTRATE, DISPLAY PANEL AND DISPLAY DEVICE

(75) Inventors: Takeshi Hara, Osaka (JP); Hirohiko Nishiki, Osaka (JP); Yoshimasa Chikama, Osaka (JP); Kazuo Nakagawa, Osaka (JP); Yoshifumi Ohta, Osaka (JP); Tetsuya Aita, Osaka (JP); Masahiko Suzuki, Osaka (JP); Okifumi Nakagawa, Osaka (JP); Yoshiyuki Miyajima, Osaka (JP); Yuuji Mizuno, Osaka (JP); Hinae Mizuno, legal representative, Yamato (JP); Michiko Takei, Osaka (JP); Yoshiyuki Harumoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 15 days.

(21) Appl. No.: 13/379,670

(22) PCT Filed: Apr. 6, 2010

(86) PCT No.: PCT/JP2010/002520
§ 371 (c)(1),
(2), (4) Date: Feb. 24, 2012

(87) PCT Pub. No.: WO2010/150446
PCT Pub. Date: Dec. 29, 2010

(65) Prior Publication Data
US 2012/0138923 A1    Jun. 7, 2012

(30) Foreign Application Priority Data

Jun. 24, 2009 (JP) ................................. 2009-149470
Oct. 9, 2009 (JP) ................................. 2009-235737

(51) Int. Cl.
*H01L 29/786* (2006.01)
*H01L 21/336* (2006.01)
*H01L 27/12* (2006.01)

(52) U.S. Cl.
CPC ........ *H01L 27/1288* (2013.01); *H01L 27/1225* (2013.01); *H01L 29/7869* (2013.01)

(58) Field of Classification Search
CPC ............................ H01L 29/786; H01L 21/336
USPC ..................................... 257/43; 438/151, 149
See application file for complete search history.

(56) References Cited

U.S. PATENT DOCUMENTS 7,297,977 B2   11/2007  Hoffman et al.
7,382,421 B2    6/2008  Hoffman et al.
(Continued)

FOREIGN PATENT DOCUMENTS

JP   2004-103957 A   4/2004
JP   2006-165528 A   6/2006
(Continued)

OTHER PUBLICATIONS

Official Communication issued in International Patent Application No. PCT/JP2010/002520, mailed on May 11, 2010.

*Primary Examiner* — Davienne Monbleau
*Assistant Examiner* — Damon Hillman
(74) *Attorney, Agent, or Firm* — Keating & Bennett, LLP

(57) ABSTRACT

The present invention provides a thin film transistor including an oxide semiconductor layer (4) for electrically connecting a signal electrode (6a) and a drain electrode (7a), the an oxide semiconductor layer being made from an oxide semiconductor; and a barrier layer (6b) made from at least one selected from the group consisting of Ti, Mo, W, Nb, Ta, Cr, nitrides thereof, and alloys thereof, the barrier layer (6b) being in touch with the signal electrode (6a) and the oxide semiconductor layer (4) and separating the signal electrode (6a) from the oxide semiconductor layer (4). Because of this configuration, the thin film transistor can form and maintain an ohmic contact between the first electrode and the channel layer, thereby being a thin film transistor with good properties.

18 Claims, 11 Drawing Sheets

(56) References Cited

U.S. PATENT DOCUMENTS

| | | |
|---|---|---|
| 7,791,072 B2 | 9/2010 | Kumomi et al. |
| 7,868,326 B2 | 1/2011 | Sano et al. |
| 2004/0209407 A1* | 10/2004 | Chae .......................... 438/149 |
| 2005/0039670 A1 | 2/2005 | Hosono et al. |
| 2006/0113536 A1 | 6/2006 | Kumomi et al. |
| 2006/0113539 A1 | 6/2006 | Sano et al. |
| 2006/0181198 A1* | 8/2006 | Gotoh et al. .................. 313/503 |
| 2007/0052025 A1 | 3/2007 | Yabuta |
| 2007/0072439 A1* | 3/2007 | Akimoto et al. ............. 438/795 |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0001374 A1 | 1/2009 | Inoue et al. |
| 2009/0008639 A1 | 1/2009 | Akimoto et al. |
| 2009/0239335 A1 | 9/2009 | Akimoto et al. |
| 2009/0305461 A1 | 12/2009 | Akimoto et al. |
| 2010/0136743 A1 | 6/2010 | Akimoto et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |

FOREIGN PATENT DOCUMENTS

| | | |
|---|---|---|
| JP | 2006-173580 A | 6/2006 |
| JP | 2007-073705 A | 3/2007 |
| JP | 2007-123861 A | 5/2007 |
| JP | 2007-235102 A | 9/2007 |
| JP | 4164562 B2 | 10/2008 |

* cited by examiner

THIN FILM TRANSISTOR, METHOD FOR MANUFACTURING SAME, ACTIVE MATRIX SUBSTRATE, DISPLAY PANEL AND DISPLAY DEVICE

TECHNICAL FIELD

The present invention relates to a thin film transistor, a method for manufacturing the same, an active matrix substrate, a display panel, and a display device.

BACKGROUND ART

Thin film transistors (TFTs) are one example of field-effect transistors, and widely used especially in liquid crystal display devices, and organic EL display devices, etc.

Conventionally, silicon is popularly used as a material from which a channel layer (semiconductor layer) constituting the TFTs is formed. Recently, TFTs whose channel layer is made from an oxide semiconductor has been intensively studied.

As some examples of TFTs using an oxide semiconductor, Patent Literature 1 discloses a transparent thin-film field-effect transistor in which a thin film of homologous compound monocrystal $InMO_3(ZnO)_m$ (M=In, Fe, Ga, or Al, m=an integer not less than 1 but not less than 50) is used as an active layer. Meanwhile, Patent Literature 2 discloses an image display device in which an amorphous oxide whose electron carrier concentration is less than $10^{18}/cm^3$ is used as an active layer of a field-effect transistor.

Further, Patent Literature 3 discloses a thin film transistor in which an oxide semiconductor whose main constituent elements are In-M-Zn—O (M is at least one of Ga, Al, and Fe) is used as a channel layer, wherein the channel layer made from the oxide semiconductor is covered with a protection film.

CITATION LIST

Patent Literatures

Patent Literature 1
Japanese Patent Application Publication, Tokukai, No. 2004-103957 (Publication Date: Apr. 2, 2004)
Patent Literature 2
Japanese Patent Application Publication, Tokukai, No. 2006-165528 (Publication Date: Jun. 22, 2006)

SUMMARY OF INVENTION

Technical Problem

It is expected that a TFT using an oxide semiconductor as a semiconductor constituting the TFT as in the conventional arts disclosed in Patent Literatures 1 to 3 can be realized with a higher visible light transmissivity than a TFT using silicon, can operate more stably under light radiation, and can operate at a high speed.

Incidentally, in case where wiring, electrodes etc. constituting the TFT are made from a metal(s) having a large resistance, a risk for a voltage drop is high, which causes writing failure. Therefore, arts in which the wiring, electrodes etc. are made from low resistant metals such as copper have been developed.

However, in case, as in the conventional arts, the channel layer is made from an oxide semiconductor, the use of, for example, copper to form an electrode in touch with the channel layer would possibly result in bonding the copper with oxygen in the oxide semiconductor. In this case, the oxide semiconductor is converted into an N-type semiconductor by removing oxygen therefrom, while the copper is turned into a P-type semiconductor by bonding with the oxygen. Thus, an ohmic contact can be no longer formed between the channel layer and the electrode, thereby deteriorating TFT properties. None of the Patent Literatures 1 to 3 describes how to deal with such a problem.

The present invention was accomplished in view of the aforementioned problem, and an object of the present invention is to provide a TFT having such an excellent feature that an ohmic contact can be formed and maintained between a channel layer and an electrode.

Solution to Problem

In order to attain the object, a thin film transistor according to the present invention is a thin film transistor including: a channel layer for electrically connecting a first electrode and a second electrode, the channel layer being made from an oxide semiconductor; and a first barrier layer made from at least one selected from the group consisting of Ti, Mo, W, Nb, Ta, Cr, nitrides thereof, and alloys thereof, the first barrier layer being in touch with the first electrode and the channel layer and separating the first electrode from the channel layer.

With this configuration, the first barrier layer electrically connects the first electrode and the channel layer but separates the first electrode from the channel layer. Thus, the first barrier layer prevents the first electrode and the channel layer from being in direct touch with each other. Even if the first electrode is made from a metal (such as Cu) easily oxidized and converted into an oxide with oxygen in the oxide semiconductor constituting the channel layer, this configuration prevents the metal from being oxidized converted into an oxide with the oxygen in the oxide semiconductor. This prevents the oxide semiconductor from being converted into an N-type semiconductor by being deprived of oxygen thereof, and prevents the metal in the first electrode from being converted into an oxide, which is a P-type semiconductor. As a result, the thin film transistor can form and maintain an ohmic contact between the first electrode and the channel layer, thereby being a thin film transistor with good properties.

A method according to the present invention is a method for manufacturing a thin film transistor including a channel layer for electrically connecting a first electrode and a second electrode, the channel layer being made from an oxide semiconductor, the method including: a channel layer forming step for forming the channel layer on a substrate; a barrier layer forming step for forming, on the channel layer, a first barrier layer made from at least one selected from the group consisting of Ti, Mo, W, Nb, Ta, Cr, nitrides thereof, and alloys thereof; and an electrode forming step for depositing the first electrode on the first barrier layer, the first barrier layer being in touch with the first electrode and the channel layer and separating the first electrode from the channel layer.

With this configuration, the method makes it possible to manufacture such a thin film transistor that the first barrier layer electrically connects the first electrode and the channel layer but separates the first electrode from the channel layer. Thus, the first barrier layer prevents the first electrode and the channel layer from being in direct touch with each other. Even if the first electrode is made from a metal (such as Cu) easily oxidized and converted into an oxide with oxygen in the oxide semiconductor constituting the channel layer, this configuration prevents the metal from being oxidized converted into an oxide with the oxygen in the oxide semiconductor. This prevents the oxide semiconductor from being converted into an N-type semiconductor by being deprived of oxygen thereof, and prevents the metal in the first electrode from being converted into an oxide, which is a P-type semiconductor. As a result, the method makes it possible to manufacture a thin film transistor, which can form and maintain an ohmic contact between the first electrode and the channel layer, thereby being a thin film transistor with good properties.

Advantageous Effects of Invention

The present invention provides a thin film transistor including: a channel layer for electrically connecting a first electrode and a second electrode, the channel layer being made from an oxide semiconductor; and a first barrier layer made from at least one selected from the group consisting of Ti, Mo, W, Nb, Ta, Cr, nitrides thereof, and alloys thereof, the first barrier layer being in touch with the first electrode and the channel layer and separating the first electrode from the channel layer. Because of this configuration, the thin film transistor can form and maintain an ohmic contact between the first electrode and the channel layer, thereby being a thin film transistor with good properties.

For a fuller understanding of the nature and advantages of the invention, reference should be made to the ensuing detailed description taken in conjunction with the accompanying drawings.

DESCRIPTION OF EMBODIMENTS

Embodiment 1

Embodiment 1 of the present invention is described below.

In the present invention, a liquid crystal display device (display device) of an active matrix type, provided with a thin film transistor (hereinafter, may be referred to as an TFT) is described.

Figure 2:
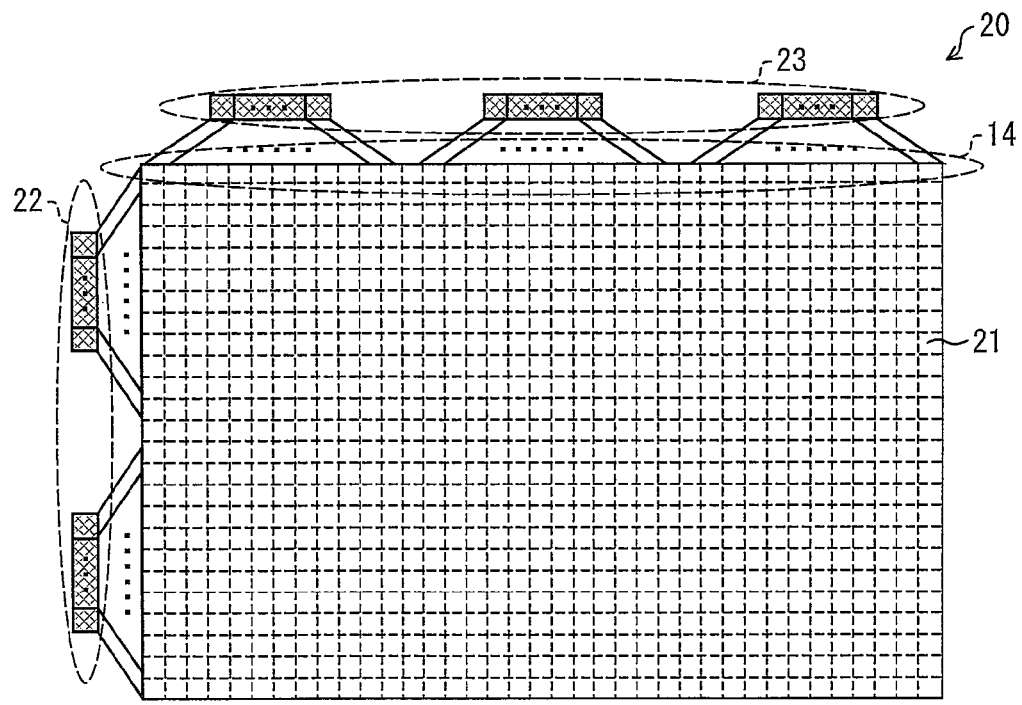
FIG. 2 is a plan view illustrating an active matrix substrate as a whole according to one embodiment of the present invention.
Figure 3:
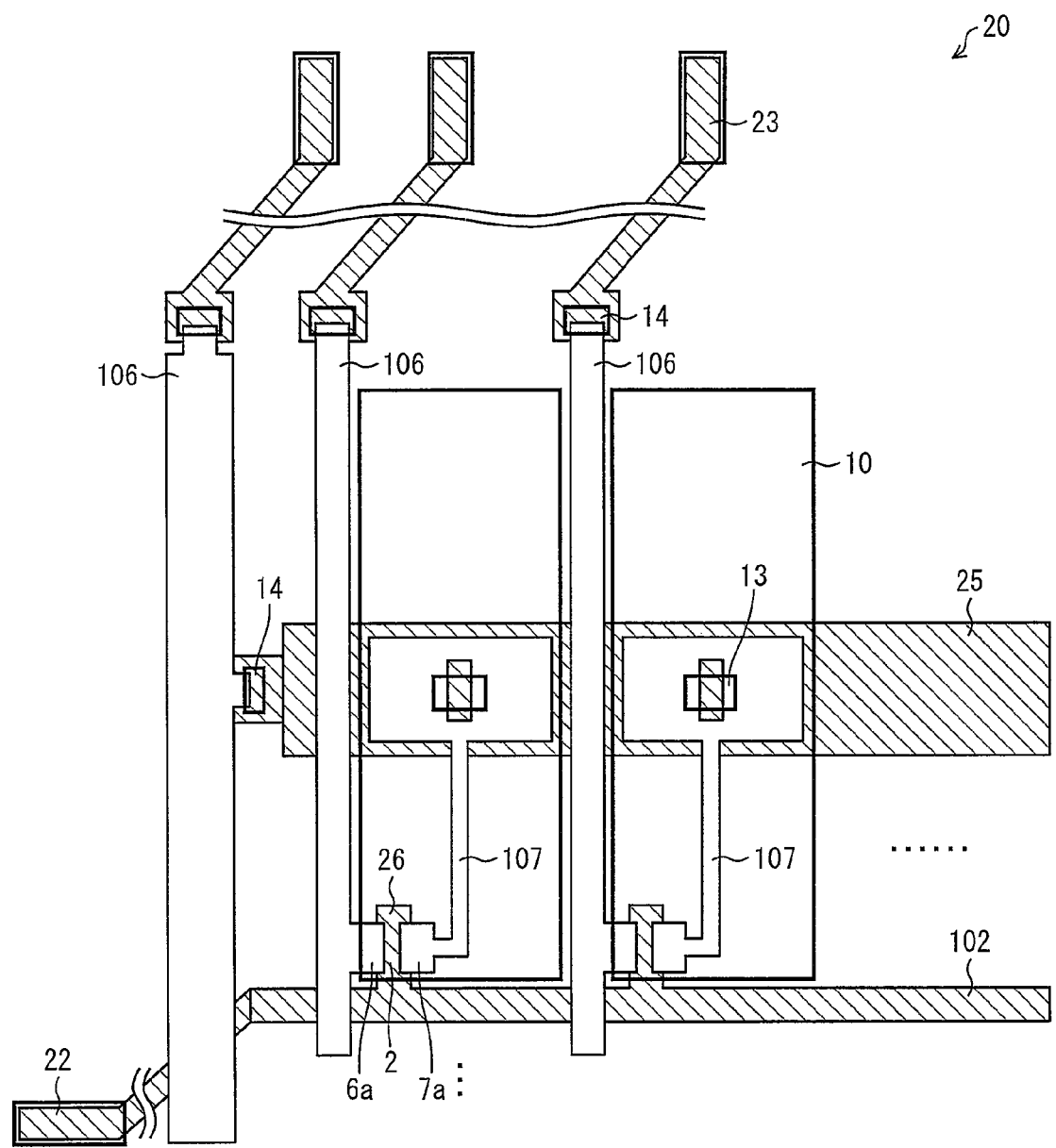
FIG. 3 is a schematic view illustrating a wiring configuration of the active matrix substrate illustrated in FIG. 2.

To be given with, a configuration of the liquid crystal display device according to the present embodiment is described, referring to FIGS. 2 and 3.

(Liquid Crystal Display Device)

The liquid crystal display device according to the present embodiment includes a liquid crystal panel (display panel) in which an active matrix substrate 20 and a counter substrate 40 are assembled together with a liquid crystal layer (not illustrated) sandwiched therebetween.

FIG. 2 is a plan view illustrating an active matrix substrate 20 as a whole according to one embodiment of the present invention.

As illustrated in FIG. 2, the active matrix substrate 20 has a display region 21 which is provided pixel electrodes arranged in matrix and is to display therein an image to be seen by a viewer, and a non-display region which is located outside the display region and is not to show an image therein to the viewer. In the non-display region, terminal sections 22 for allowing scanning wirings 102 to receive external signals, terminal sections 23 for allowing signal wirings 106 to receive external signals, and wiring connection section 14 for connecting wiring etc. are formed.

FIG. 3 is a schematic view illustrating a wiring structure of the active matrix substrate 20 illustrated in FIG. 2.

As illustrated in FIG. 3, the active matrix substrate 20 is so configured that a plurality of scanning wirings 102 and a plurality of signal wirings 106 cross each other, and a pixel section having a TFT (thin film transistor) 26 is formed in a vicinity of intersections of the scanning wirings 102 and the signal wirings 106.

The TFT 26 includes a scanning electrode 2 provided to one scanning wiring 102, a signal electrode (first electrode) 6a provided to one signal wiring 106, and a drain electrode (second electrode) 7a.

Each of the TFTs 26 is respectively provided with a drain wiring 107 connected with the drain electrode 7a, and with a pixel electrode 10. The drain wiring 107 and the pixel electrode 10 are electrically connected with each other, thereby forming a connection section 13. Moreover, a storage capacitor wiring 25 is provided so as to form a storage capacitance between the storage capacitor wiring and the pixel electrode 10.

Figure 1:
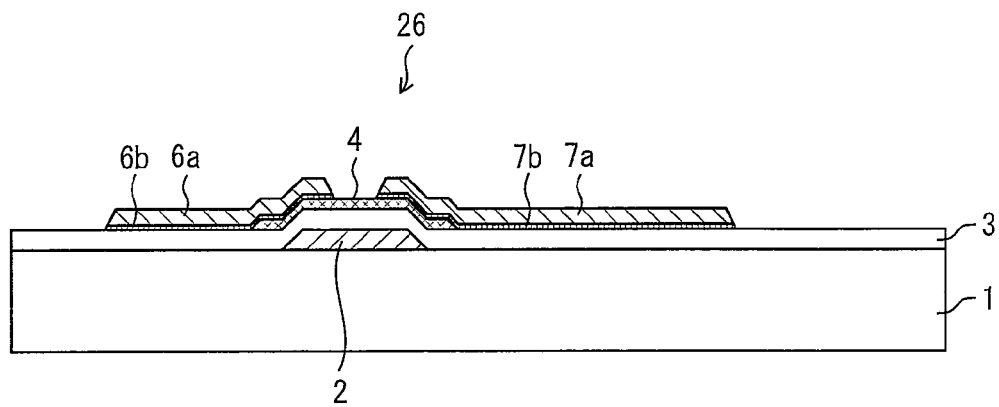
FIG. 1 is a cross sectional view illustrating a TFT according to one embodiment of the present invention for use in a liquid crystal display device.

Next, a structure of the TFT 26 is described, referring to FIG. 1.

(Configuration of TFT 26)

FIG. 1 is a cross sectional view illustrating the TFT 26 according to the present embodiment, for use in a liquid crystal display apparatus.

As illustrated in FIG. 1, the TFT 26 according to the present embodiment includes a glass 1, the scanning electrode 2, an insulating layer 3, an oxide semiconductor (channel layer 4), a barrier layer (first barrier layer) 6b, the signal electrode 6a, a barrier layer (second barrier layer) 7b, and the drain electrode 7a.

The glass 1 serves as a support for the TFT 26. It should be noted that the present invention is not limited to glass, even though the present embodiment uses glass. A material generally used for supporting the TFT 26 can be a substitute for the glass 1.

The scanning electrode 2 is made from Cu.

In the present embodiment, the scanning electrode 2 may have a two-layered structure in which, for example, a Cu layer is laminated on a Ti layer. By providing the Ti layer below the C layer, the scanning electrode 2 can be adhered to the glass 1 excellently.

The insulating layer 3 is made from silicon nitride (SiNx). The present invention is not limited to this, provided that the insulating layer 3 is a layer made from an insulating material. For example, the insulating layer 3 may have a single layer structure made from silica dioxide ($SiO_2$), a laminate structure made from SiNx and $SiO_2$, or the like structure.

The oxide semiconductor 4 is a semiconductor layer for electrical connecting the signal electrode 6a and the drain electrode 7a with each other, and is made from an oxide semiconductor. In the present embodiment, the oxide semiconductor is IGZO (In, Ga, Zn, O), which is an oxide containing indium (In), gallium (Ga), and zinc (Zn).

The oxide semiconductor may be, for example, an oxide semiconductor containing indium, gallium, aluminum (Al), silicon (Si), tin (Sn), copper (Cu), zinc, and/or the like. Further, the oxide semiconductor may be an oxide semiconductor containing In and/or Zn, and Ga, silicon (Si), aluminum (Al), tin (Sn) copper (Cu), and/or the like. Apart from IGZO mentioned above, examples of such oxide semiconductors encompasses the following combinations: (In, Si, Zn, O), (In, Al, Zn, O), (Sn, Si, Zn, O), (Sn, Al, Zn, O), (Sn, Ga, Zn, O), (Ga, Si, Zn, O), (Ga, Al, Zn, O), (In, Cu, Zn, O), (Sn, Cu, Zn, O), (Zn, O), (In, O), and the like combinations.

The signal electrode 6a is made from Cu.

The barrier layer 6b is made from titanium (Ti). Moreover, the barrier layer 6b is provided below the signal electrode 6a so as to be in touch with the signal electrode 6a and the oxide semiconductor layer 4 and separate the signal electrode 6a from the oxide semiconductor layer 4.

In the present Description, what is meant by the wording "separate" is to physically set apart one thing from the other thing so that the two things will not be in touch with each other directly. That is, in the present embodiment, the signal electrode 6a and the oxide semiconductor layer 4 are separated from each other by means of the barrier layer 6b, whereby the signal electrode 6a and the oxide semiconductor layer 4 are not in touch with each other directly. Thus, electrical connection between the signal electrode 6a and the oxide semiconductor layer 4 is established via the barrier layer 6b.

The drain electrode 7a is made from Cu.

The barrier layer 7b is made from Ti. The barrier layer 7b is provided below the drain electrode 7a, and is in touch with the drain electrode 7a and the oxide semiconductor layer 4 and to separate the drain electrode 7a from the oxide semiconductor layer 4.

That is, in the present embodiment, the drain electrode 7a and the oxide semiconductor layer 4 are separated by means of the barrier layer 7b, whereby the drain electrode 7a and the oxide semiconductor layer 4 are not in touch with each other directly. That is, electrical connection between the drain electrode 7a and the oxide semiconductor layer 4 is established via the barrier layer 7b.

In the present embodiment, the signal electrode 6a and the drain electrode 7a are not in touch with the oxide semiconductor 4 directly because the barrier layer 6b or 7b is provided. Therefore, Cu contained in the signal electrode 6a and the drain electrode 7a will not form copper oxide (CuO) by bonding with oxygen in the IGZO contained in the oxide semiconductor layer 4. This makes it possible to form and maintain an ohmic contact between the oxide semiconductor layer 4 and the signal electrode 6a or the drain electrode 7a.

Therefore, the TFT 26 in the present embodiment can be a TFT having such an excellent property that it will not be deteriorated in TFT properties, and resistance due to electrodes is low.

With this configuration, the TFT 26 of the present embodiment can be such that a carrier mobility thereof is 5 $cm^2/Vs$ or more, for example. Therefore, the use of the TFT 26, for example, makes it possible to manufacture a display panel having a large size, a high resolution, and a high-speed driving ability. Further, the use of the TFT 26 also makes it possible to reduce the number of driver and to have a gate driver with a monolithic configuration.

The present invention is not limited to the present embodiment in which the scanning electrode 2, the signal electrode 6a, and the drain electrode 7a are made from Cu. The scanning electrode 2, the signal electrode 6a, and the drain electrode 7a may be made from a metal, which is generally used as a raw material of an electrode. Especially, Cu, aluminum (Al), silver (Ag), aluminum alloy (Al alloy), and the like, which can reduce resistance of the electrode, are preferable. In the present invention, if the electrodes is made from any of these metals, it is possible to attain contact compatibility (contactability) between the electrodes and a metal oxide from which a transparent electrode, the oxide semiconductor, and the like are made. Moreover, as electrodes, Cu, Al, and Al alloy are preferable, because they can provide low resistance to the electrodes, and they are excellent in processability. The scanning electrode 2, the signal electrode 6a, and the drain electrode 7a may be made from an identical material or different materials, independently.

As the Al alloy, for example, such an alloy is preferably, which contains Al (base material), copper, and at least one selected from the group consisting of cobalt (Co), rhodium (Rh), nickel (Ni), palladium (Pd), copper (C), silicon (Si), germanium (Ge), tin (Sn) and lanthanum (La). In the configuration in which the signal electrode 6a and the drain electrode 7a are made from any of these Al alloys, the configuration of the present embodiment also prevents Cu contained in the Al alloy constituting the signal electrode 6a and the drain electrode 7a from bonding with oxygen in IGZO contained in the oxide semiconductor layer 4, thereby making it possible to form and maintain an ohmic contact between the oxide semiconductor layer 4 and the signal electrode 6a or the drain electrode 7a.

Moreover, it is preferable that Cu content in the Al alloy is 0.1 wt % or more. This allows, for example to prevent corrosion in case the electrode is formed as a film, and to give the electrode a smaller resistance. Moreover, it is preferable that the Cu content in the Al alloy is 5.0 wt % or less. This allows, for example to prevent corrosion in case the electrode is formed as a film.

The present invention is not limited to the present embodiment in which the barrier layers 6b and 7b are made from Ti, provided that the barrier layers 6b and 7b are made from any one of titanium, molybdenum (Mo), tungsten (W), niobium (Nb), tantalum (Ta), chromium (Cr), nitrides thereof, and alloys thereof. Examples of the nitrides encompass molybdenum nitride (MoN), titanium nitride (TiN), tungsten nitride (WN), niobum nitride (NbN), tangalum (TaN), chromium nitride (CrN), and the like. Moreover, examples of the alloys encompass titanium alloys, molybdenum-titanium alloy (MoTi), molybdenum-tungsten alloy (MoW), and the like.

The metals and the like mentioned above are tolerant against a chemical, plasma, or the like used in manufacturing process of TFT etc. Moreover, the metals and the like mentioned above are excellent in processability and thus can be patterned into shapes as desired. Further, the metals and the like mentioned above have heat tolerance, a high degree of adhesion with the insulating layer, and an excellent contact compatibility with metal oxides (transparent electrode, oxide semiconductor, ant the like). Thus, the metals and the like mentioned above are suitably applicable to the barrier layers 6b and 7b.

Further, it is more preferable that the barrier layer 6b and 7b is made from titanium, molybdenum, a titanium alloy, molybdenum-titanium or the like. These metals are excellent in anti-corrosion property, and has a good contact compatibility with metal oxides. Moreover, these metals can be dry-etched and wet-etched in patterning. Thus, these metals are highly applicable to the manufacturing processes of TFT etc.

In the present invention, the barrier layers can compensate for the heat tolerance and/or contact compatibility of the metal from which the electrodes are made, if the heat tolerance and/or contact compatibility is insufficient.

Moreover, in the present invention, the first barrier layer or the second barrier layer is not particularly limited to the aforementioned configuration, provided that the first barrier layer or the second barrier layer is in touch with the channel layer and the first electrode or the second electrode, and the first barrier layer or the second barrier layer separate the first electrode or the second electrode from the channel layer.

Here, the TFT 26 of the present embodiment and a conventional TFT having a conventional configuration are compared with each other.

Figure 12:
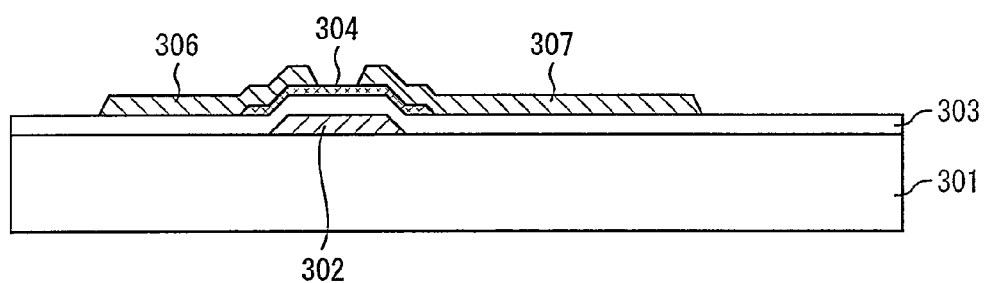
FIG. 12 is a view illustrating a cross sectional structure of a conventional TFT.

FIG. 12 is a view illustrating a cross sectional structure of a conventional TFT.

The conventional TFT includes, as illustrated in FIG. 12, glass 301, a scanning electrode 302, an insulating layer 303, an oxide semiconductor layer 304 (serving as a channel layer), a signal electrode 306, and a drain electrode 307.

Here, in case where the signal electrode 306 and the drain electrode 307 are made from Cu, or an Al alloy containing Cu or the like material containing Cu, oxygen in an oxide semiconductor of the oxide semiconductor layer 304 is bonded with Cu to form CuO, at a heating process after film formation of the Cu, or Al alloy or like material containing Cu. This deprives the oxide semiconductor of oxygen, thereby converting the oxide semiconductor into an N-type semiconductor, while converting the Cu, or Al alloy containing Cu or like material containing Cu into a P-type semiconductor by forming CuO. This makes it impossible to form an ohmic contact between the signal electrode 306 or the drain electrode 307 and the oxide semiconductor layer 304. As a result, the TFT properties of the conventional TFT is deteriorated because, for example, current (on-current) flowing the oxide semiconductor layer 304 at voltage application on the scanning electrode 302 and the signal electrode 306 is reduced, and carrier mobility is reduced.

On the other hand, the TFT 26 of the present embodiment, as described above, can form an ohmic contact between the signal electrode 6a or the drain electrode 7a and the oxide semiconductor layer 4, even if these electrode is made from Cu or an Al material containing Cu or the like containing Cu. Thus, the TFT 26 of the present embodiment is more excellent in property than the conventional TFT.

Next, the cross sectional structures and manufacturing processes of the active matrix substrate 20 and the counter substrate 40 of the liquid crystal display device are described below.

(Cross Sectional Structure and Manufacturing Process of Active Matrix Substrate 20)

Figure 4:
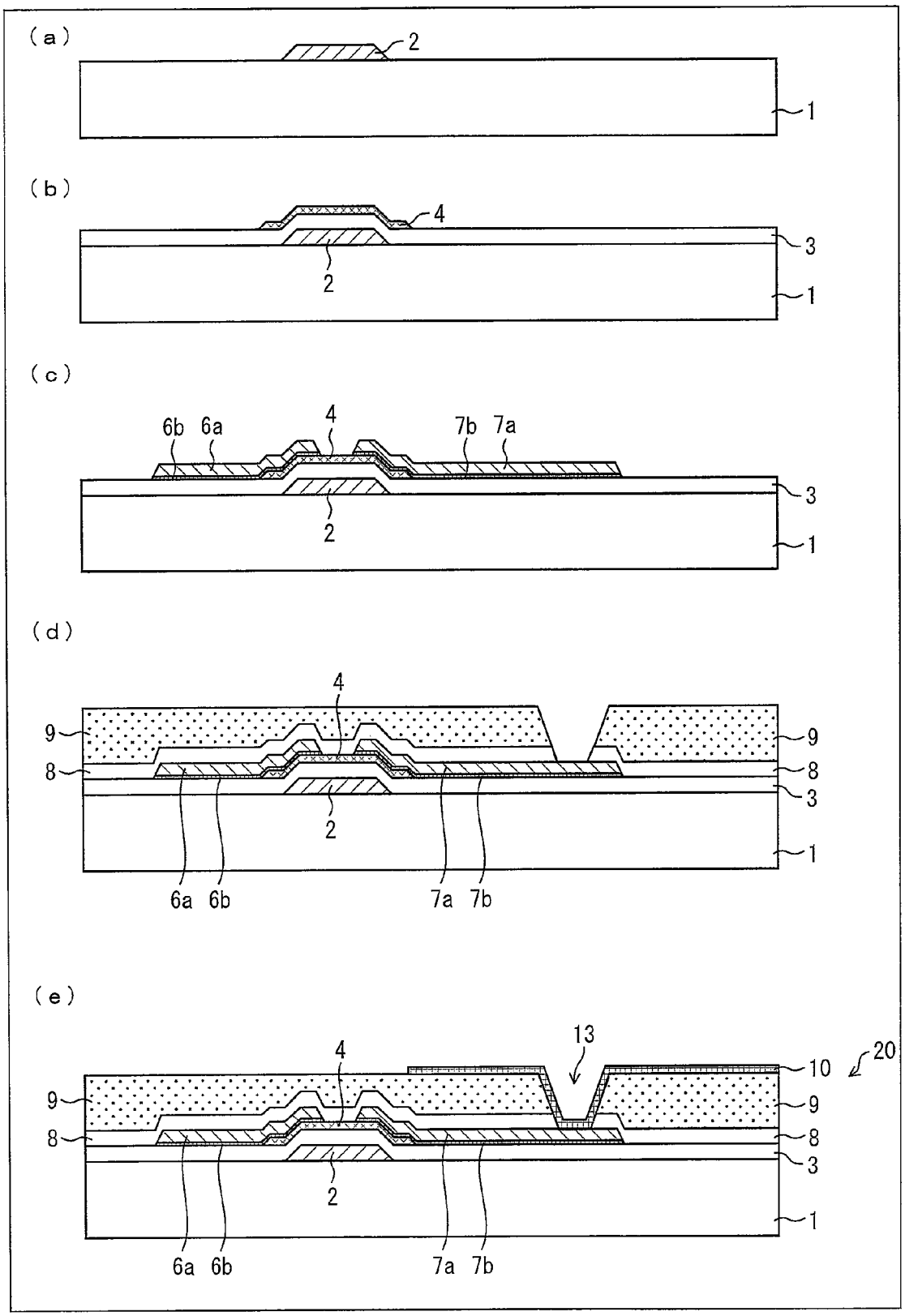
FIG. 4(a) to (e) of FIG. 4 are views illustrating a cross sectional structure after steps in a manufacturing process of an active matrix substrate according to one embodiment of the present invention.

The cross sectional structure and manufacturing process of the active matrix substrate 20 are described blow, referring to (a) to (e) of FIG. 4.

(a) to (e) of FIG. 4 are views illustrating a cross sectional structure after steps in the manufacturing process of the active matrix substrate 20 according to one embodiment of the present invention. The cross section illustrated in (a) to (e) of FIG. 4 is part of the active matrix substrate 20, which part is in the vicinity of the TFT 26. Thus, the TFT 26 and the active matrix substrate 20 are manufactured in the same manufacturing process. Here, the cross sectional structure and manufacturing process of the active matrix substrate 20 are described, referring to the vicinity of the TFT 26.

To begin with, the cross sectional structure of the active matrix substrate 20 is described, referring to (e) of FIG. 4.

In the vicinity of the TFT 26, the active matrix substrate 20 includes, as illustrated in (e) of FIG. 4, a protection layer 8, an interlayer insulating layer 9, and the pixel electrode 10.

The protection layer 8 is a layer for covering and thereby protecting the signal electrode 6a, the drain electrode 7a, the oxide semiconductor layer 4, and the like. The protection layer 8 is made from SiNx. Note that the protection layer 8 is not limited to SiNx, and may have a monolayer structure made from $SiO_2$, a lamination structure having a SiNx layer and a $SiO_2$ layer, or the like structure.

The interlayer insulating layer 9 is made from a photosensitive interlayer insulating film material. The photosensitive interlayer insulating film material may be preferably a material having a photosensitive property, for example. The photosensitive interlayer insulating film material may be a photosensitive acrylic resin.

The pixel electrode 10 is made from indium tin oxide (ITO). Note that pixel electrode 10 is not limited to this, and may be made from, for example, a transparent electrical conductive material such as indium zinc oxide (IZO).

Next, the manufacturing process of the active matrix substrate 20 is described, referring to the vicinity of the TFT 26, thereby describing a manufacturing method of the TFT 26. The active matrix substrate 20 is manufactured by 5 times photolithography steps. Referring (a) to (e) of FIG. 4, the manufacturing process of the active matrix substrate 20 according to the present embodiment is described in the following (1) to (5) in the order of the steps thereof.

Here, the manufacturing process is described based on the case where the signal electrode 6a and the drain electrode 7a are made from Cu. However, the manufacturing process can be similar in case where the case where the signal electrode 6a and the drain electrode 7a are made from a material other than Cu, such as Al, Ag, an Al alloy, or the like.

(1) First Step

In the first step, the scanning electrode 2 is formed as illustrated in (a) of FIG. 4.

By sputtering, a Cu film is formed on the glass 1. A resist pattern is formed of the Cu film by photolithography. By wet etching, the scanning electrode 2 is patterned from the Cu film, and then the resist is removed and washed away therefrom.

In this step, it is preferable that the Cu film is formed with a film thickness in a range of 200 nm to 500 nm. However, the present invention is not limited to the film thickness.

In case where the scanning electrode 2 have a two-layered structure having a Ti layer and a Cu layer, it is preferable that the Ti layer is formed with a film thickness in a range of 30 nm to 100 nm.

(2) Second Step

In the second step, as illustrated in (b) of FIG. 4, the insulating layer 3 is formed on the substrate and then a step (channel layer forming step) of forming the oxide semiconductor layer 4 on the substrate thus formed is carried out.

In this Description, what is meant by the term "substrate" is a substrate on which the channel layer and the electrode of the TFT are formed. Here, the substrate on which the scanning electrode 2 and the insulating layer 3 are formed is referred to as "substrate".

By using a CVD method, a SiNx layer is formed as the insulating layer 3, thereby producing the substrate.

Next, by sputtering, an IGZO layer is formed as the oxide semiconductor layer 4 on the substrate. By photolithography, a resist pattern is formed thereon. By wet etching, the oxide semiconductor layer 4 is patterned, and then the resist is removed and washed away therefrom.

In this step, it is preferable that the SiNx layer is formed with a film thickness in a range of 200 nm to 500 nm, and that the IGZO layer is formed with a film thickness in a range of 30 nm to 300 nm. Note that present invention is not limited to these film thicknesses.

(3) Third Step

In the third step, as illustrated in (c) of FIG. 4, a barrier layer forming step for forming the barrier layers 6b and 7b on the oxide semiconductor layer 4, and an electrode forming step for forming the signal electrode 6a and the drain electrode 7a on the barrier layers 6b and 7b are carried out. In this step, a film to be the barrier layers 6b and 7b is formed as one layer, and a film to be the signal electrode 6a and the drain electrode 7a is formed as one layer. Then, these films are patterned into the barrier layers 6b and 7b, and the signal electrode 6a and the drain electrode 7a respectively by patterning.

After a Ti film is formed to be the barrier layers 6a and 7b are formed by sputtering. Then, a Cu film to be the signal electrode 6a and the drain electrode 7a is formed. A resist pattern is formed thereon by photolithography. By wet etching, the Cu film is etched. Then, the Ti film is etched by dry etching. In this way, the signal electrode 6a, the drain electrode 7a, and the barrier layers 6b and 7b are formed with their respective patterns. After that, the resist is removed and washed away therefrom.

In this step, it is preferable that the Ti film is formed with a film thickness in a range of 30 nm to 100 nm, and the Cu film is formed with a film thickness in a range of 100 nm to 400 nm. However, the present invention is not limited to these film thicknesses.

Further, the Ti film may be etched by wet etching. In this case, however, there is a risk that the IGZO constituting the oxide semiconductor layer 4 below the Ti film would possibly etched by the wet etching. Thus, the use of dry etching is more preferably, as described above.

(4) Fourth Step

In the fourth step, as illustrated in (d) of FIG. 4, the protection layer 8 and the interlayer insulating layer 9 are formed.

By a CVD method, a SiNx layer to be the protection layer 8 is formed. Next, a film of a photosensitive insulating film material is formed as a film to be the interlayer insulating layer 9. By photolithography, the photosensitive insulating film material is patterned. By dry etching, the protection layer 8 and the interlayer insulating layer 9 are patterned.

In this step, the SiNx layer to be the protection layer 8 is formed with a film thickness in a range of 100 nm to 700 nm. However, the present invention is not limited to this film thickness.

This step etches the protection layer 8 and the interlayer insulating layer 9, so as to form the connection section 13, for example.

(5) Fifth Step

In the fifth step, as illustrated in (e) of FIG. 4, the pixel electrode 10 is formed.

By sputtering, an ITO film to be the pixel electrode 10 is formed. By photolithography, a resist pattern is formed thereon. By wet etching, a patter of the pixel electrode 10 is formed. Then, the resist is removed and washed away therefrom.

By this, in the connection section 13, a drain wiring 107 connected with the drain electrode 7a is connected with the pixel electrode 10.

In this step, it is preferable that the ITO to be the pixel electrode 10 is formed with a film thickness of 50 nm to 200 nm. However, note that the present invention is not limited to this film thickness.

The manufacturing method of the TFT 26 according to the present embodiment includes, at least, the channel layer forming step and the barrier layer forming step, and an electrode step.

In the present embodiment, it is possible to form a gate driver on the same substrate by using the manufacturing process.

(Cross Sectional Structure and Manufacturing Process of Counter Substrate 40)

Next, the cross sectional structure and the manufacturing process of the counter substrate 40 are described below, referring to (a) to (c) of FIG. 5.

Figure 5:
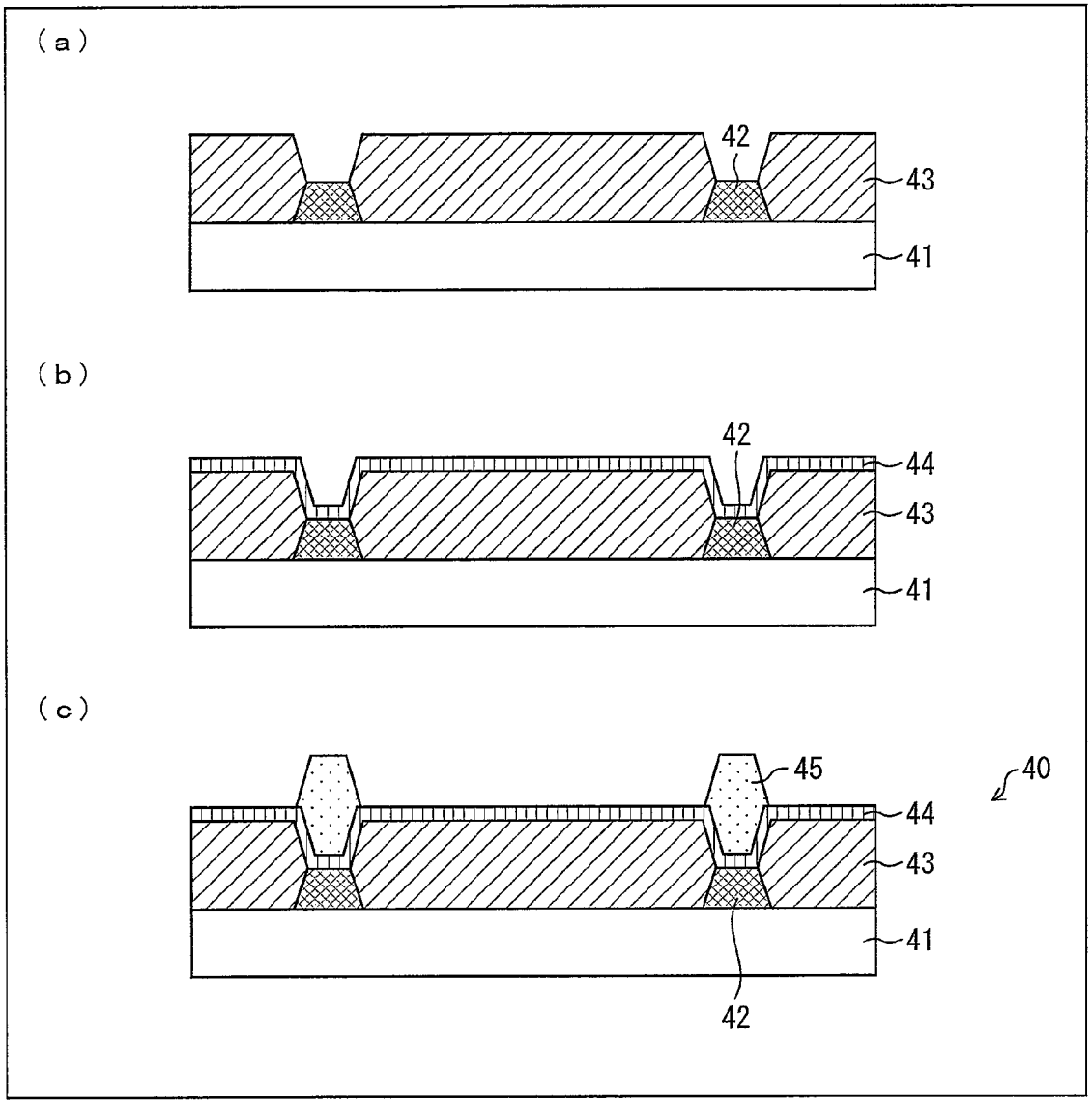
FIG. 5(a) to (c) of FIG. 5 are views illustrating a cross sectional structure after steps in a manufacturing process of a counter substrate according to one embodiment of the present invention.

(a) to (c) of FIG. 5 are views illustrating a cross sectional structure after steps in a manufacturing process of the counter substrate 40 according to one embodiment of the present invention.

The counter substrate 40 includes, as illustrated in (c) of FIG. 5, glass 41, a black matrix 42, a color filter layer 43, a counter electrode 44, and a photo spacer 45.

The counter substrate 40 is manufacturing by 3-time photolithography process. The manufacturing process of the counter substrate 40 according to the present embodiment is described in the following (1) to (3) in the order of the steps, referring to (a) to (c) of FIG. 5.

(1) Formation of Black Matrix 42 and Color Filter Layer 43

As illustrated in (a) of FIG. 5, by photolithography using a photosensitive material, the black matrix 42, and the color filter layer 43 for red, green and blue are formed on the glass 41.

(2) Formation of Counter Electrode 44

Next, as illustrated in (b) of FIG. 5, by sputtering, an ITO film to be the counter electrode 44 is deposited with a film thickness in a range of 50 nm to 200 nm, and then the ITO film is patterned by photolithography and wet etching, thereby forming the counter electrode 44.

(3) Formation of Photo spacer 45

Next, as illustrated in (c) of FIG. 5, the photo spacer 45 is formed by photolithography using a photosensitive material.

By the processes described above, the active matrix substrate 20 and the counter substrate 40 are manufactured. However, it should be noted that the present invention is not limited to the materials, the film thicknesses, and the methods applied in each step. In the present invention, it is possible to employ materials and methods which have been generally used conventionally as materials and methods of the active matrix substrate 20 and the counter substrate 40.

The liquid crystal display device according to the present embodiment is manufactured by carrying out an assembling process as described below, after the manufacturing processes of the active matrix substrate 20 and the counter substrate 40. In the following, the assembling step is described in brief.

(Assembling Process)

In the assembling step, the active matrix substrate 20 and the counter substrate 40 thus manufactured by the aforementioned processes are assembled to sandwich a liquid crystal layer therebetween. In this way, a liquid crystal panel is manufactured.

The assembling process is described in the following (1) to (3) in the order of the steps.

(1) Formation of Alignment Film

By a printing method, a polyimide is formed into an alignment film on each of the active matrix substrate 20 and the counter substrate 40 thus manufactured by the processes described above.

(2) Liquid Crystal One Drop Filling Process and Assembling

Then, a sealing agent is printed on the active matrix substrate 20 and the counter substrate 40. Then, one drop filling Process of a liquid crystal is performed. After that, the active matrix substrate 20 and the counter substrate 40 are assembled together.

(3) Cutting of Substrate

Then, the assembled substrate is cut by dicing.

By the steps described above, a liquid crystal panel is manufactured, in which a liquid crystal layer is formed between the active matrix substrate 20 and the counter substrate 40 assembled together.

Further, by using the liquid crystal panel thus manufactured, the liquid crystal display device according to the present embodiment is manufactured.

Note that the TFT according to the present invention is not limited to such an active matrix substrate, but is also applicable to various substrate or the like provided with a TFT. The use of the TFT according to the present invention makes it possible to manufacture a substrate provided with a TFT having good property.

Moreover, the active matrix substrate and the display panel according to the present invention is not limited to the liquid crystal display device, and is applicable to, for example, display devices employing organic EL, inorganic EL, electrophoresis, or the like. By using the active matrix substrate or the display panel according to the present invention, it is possible to manufacture a display device with a larger size, a high resolution, and an ability of performing high speed driving, because the display device is provided with TFTs having good property.

Embodiment 2

Another embodiment of the present invention is described below. Here, only what is different from Embodiment 1 is described. The like members having the like configuration are labeled with the same reference numerals and their explanation is not repeated here.

A cross sectional configuration and a manufacturing process of an active matrix substrate 20 according to the present embodiment is described below, referring to (a) to (e) of FIG. 6.

Figure 6:
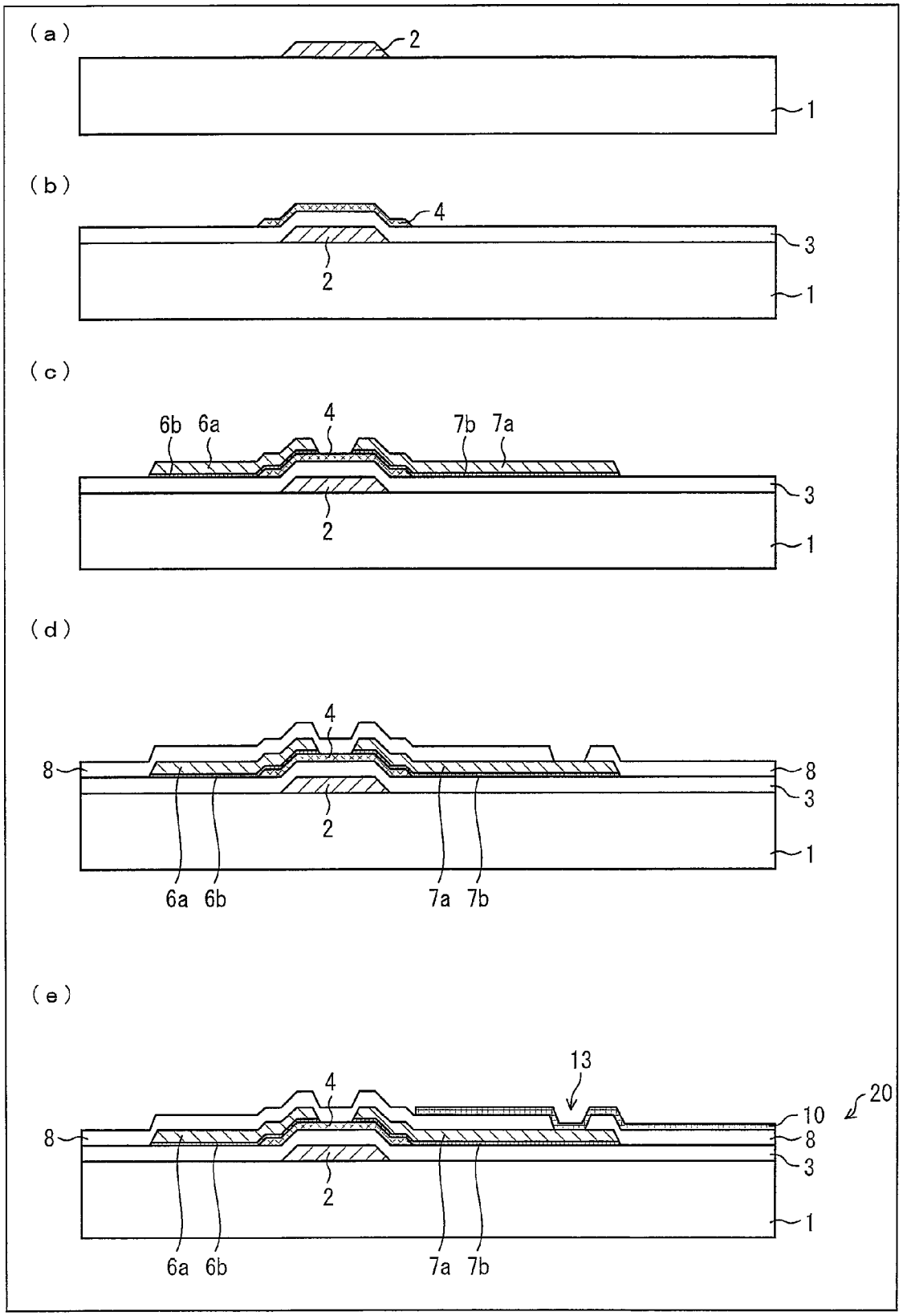
FIG. 6(a) to (e) of FIG. 6 are views illustrating a cross sectional structure after steps in a manufacturing process of an active matrix substrate according to another one embodiment of the present invention.

(a) to (e) of FIG. 6 are views illustrating a cross sectional structure after steps in a manufacturing process of the active matrix substrate 20 according to another one embodiment of the present invention. The cross section illustrated in (a) to (e) of FIG. 6 is part of the active matrix substrate 20, which part is in the vicinity of the TFT 26. Here, the cross sectional structure and manufacturing process of the active matrix substrate 20 are described, referring to the vicinity of the TFT 26.

In the vicinity of the TFT 26, the active matrix substrate 20 according to the present embodiment includes, as illustrated in (e) of FIG. 6, glass 1, a scanning electrode 2, an insulating layer 3, an oxide semiconductor layer 4, barrier layers 6b and 7b, a signal electrode 6a, a drain electrode 7a, a protection layer 8, and a pixel electrode 10.

That is, a liquid crystal display device according to the present embodiment is identical with that of Embodiment 1, except that the active matrix substrate 20 has no interlayer insulating layer 9 provided in Embodiment 1.

The manufacturing process of the active matrix substrate 20 of the present embodiment is different from that of Embodiment 1 in (4) the fourth step. Thus, only the fourth step is described below. That is, the first, second, third, and fifth steps are carried out in the same manner as in Embodiment 1, and their explanation is not repeated here. The cross section after the first, second, third, and fifth steps is illustrated in (a), (b), (c), and (e) of FIG. 6, respectively.

(4) Fourth Step

In the fourth step, as illustrated in (d) of FIG. 6, only the protection layer 8 is formed.

By a CVD method, a SiNx layer to be the protection layer 8 is formed. By photolithography, a resist pattern is formed thereon. By dry etching, the protection layer 8 is patterned. After that, the resist is removed and washed away therefrom.

In this step, it is preferable that the SiNx layer to be the protection layer 8 is formed with a film thickness in a range of 100 nm to 700 nm. However, the present invention is not limited to this film thickness.

In this step, for example, the protection layer 8 is etched to form a connection section 13 in which a drain wiring 107 and the pixel electrode 10 are to be connected.

Next, the fifth step described in Embodiment 1 is carried out, so as to manufacture the active matrix substrate 20 as illustrated in (e) of FIG. 6.

Embodiment 3

Still another embodiment of the present invention is described below. Here, only what is different from Embodiment 1 is described. The like members having the like configuration are labeled with the same reference numerals and their explanation is not repeated here.

A cross sectional structure and a manufacturing process of an active matrix substrate 20 according to the present embodiment are described below, referring to (a) and (b) of FIG. 7.

Figure 7:
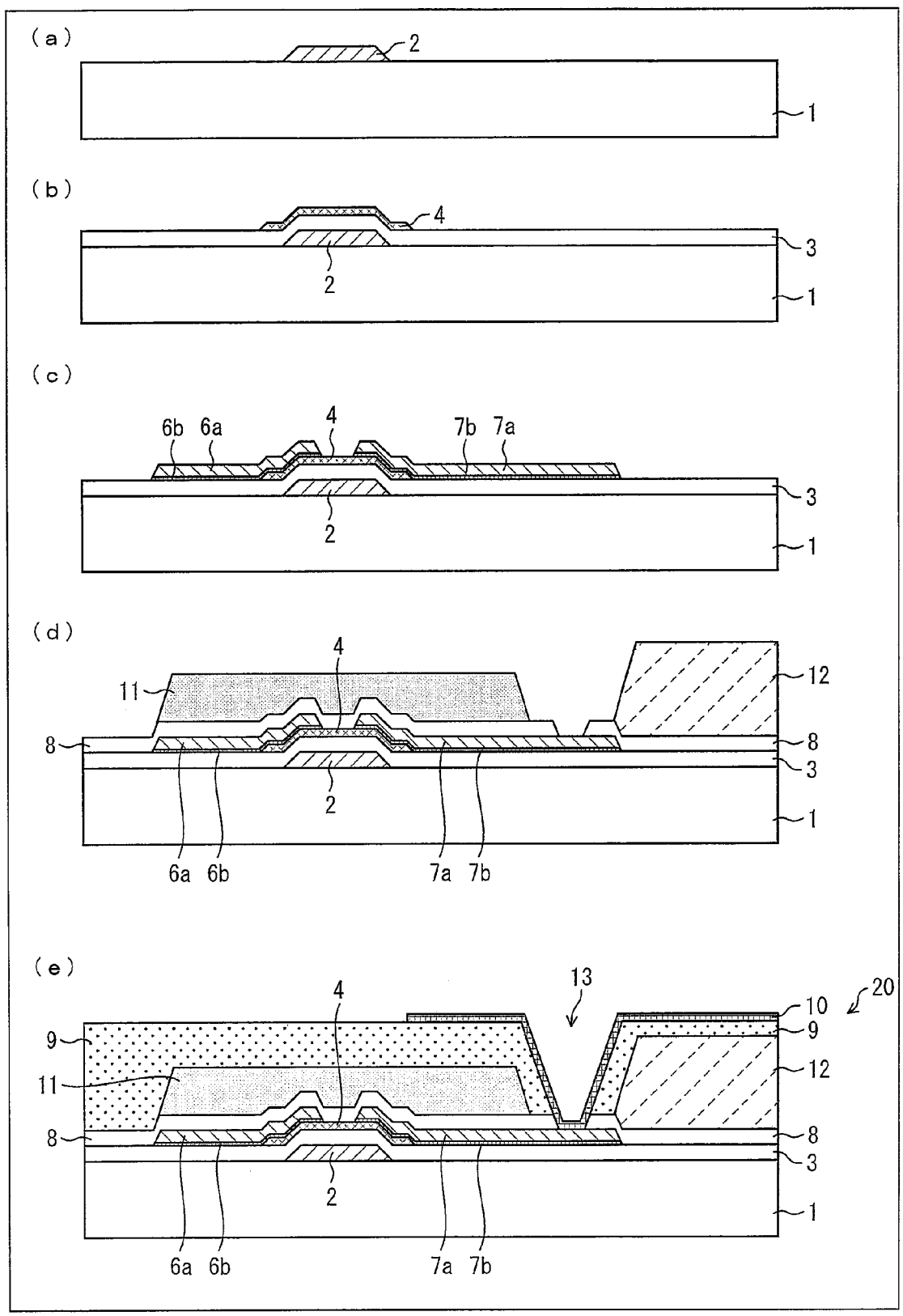
FIG. 7(a) to (e) of FIG. 7 are views illustrating a cross sectional structure after steps in a manufacturing process of an active matrix substrate according to still another one embodiment of the present invention.

(a) to (e) of FIG. 7 are views illustrating a cross sectional structure after steps in a manufacturing process of an active matrix substrate according to still another one embodiment of the present invention. The cross section illustrated in (a) to (e) of FIG. 6 is part of the active matrix substrate 20, which part is in the vicinity of the TFT 26. Here, the cross sectional structure and manufacturing process of the active matrix substrate 20 are described, referring to the vicinity of the TFT 26.

In the vicinity of the TFT 26, the active matrix substrate according to the present embodiment includes, as illustrated in Fig. (e) of FIG. 7, glass 1, a scanning electrode 2, an insulating layer 3, an oxide semiconductor layer 4, barrier layers 6b and 7b, a signal electrode 6a, a drain electrode 7a, a protection layer 8, a black matrix 11, a color filter layer 12, an interlayer insulating layer 9, and a pixel electrode 10.

Moreover, a counter substrate 40 according to the present embodiment includes no black matrix 42 and color filter 43 thereon, even though it is not illustrated here.

That is, a liquid crystal display device according to the present embodiment is identical with Embodiment 1, except that the active matrix substrate 20 includes the black matrix 11 and the color filter layer 12 between the protection layer 8 and the interlayer insulating layer 9, and that the counter substrate includes no black matrix 42 and color filter layer 43 thereon.

With this configuration, the liquid crystal display device is provided with the active matrix substrate 20 having a so-called color filter-on-array (COA) structure.

The manufacturing process of the active matrix substrate 20 according to the present embodiment is identical with that of Embodiment 1, except for (4) fourth step and (5) fifth step. Thus, only the fourth step and the fifth step are described below. That is, the first step, the second step, and the third steps are carried out in the same manner as in Embodiment 1, and their explanation is not repeated here. The cross section after the first, second and third steps are illustrated in (a), (b), and (c) of FIG. 7, respectively.

(4) Fourth Step

In the fourth step, as illustrated in (d) of FIG. 7, the protection layer 8, the black matrix 11, and the color filter layer 12 are formed.

By a CVD method, a SiNx layer to be the protection layer 8 is formed. Then, by photolithography using a photosensitive material, the black matrix 11 and the color filter layer 12 for red, green, and blue are formed.

In this step, it is preferable that the SiNx layer to be the protection layer 8 is formed with a film thickness in a range of 100 nm to 700 nm. However, the present invention is not limited to this film thickness.

(5) Fifth Step

In the fifth step, as illustrated in (e) of FIG. 7, the interlayer insulating layer 9 and the pixel electrode 10 are formed.

A film of a photosensitive interlayer insulating material to be the interlayer insulating layer 9 is formed. Then, the photosensitive interlayer insulating material is patterned by photolithography. By dry etching, the protection layer 8 and the interlayer insulating layer 9 are patterned. By this, the protection layer 8 and the interlayer insulating layer 9 are etched to form a connection layer 13, for example.

Next, by sputtering, an ITO film to be the pixel electrode 10 is formed. Then, a resist pattern is formed thereon by photolithography. Then, by wet etching, the pixel electrode 10 is patterned. After that, the resist is removed and washed away therefrom.

In this step, it is preferable that the ITO to be the pixel electrode 10 is formed with a film thickness in a range of 50 nm to 200 nm. However, the present invention is not limited to this film thickness.

By this step, the drain electrode 7a connected with the drain wiring 107 is connected with the pixel electrode 10 in the connection section 13.

By the steps described above, the active matrix substrate 20 is produced.

Moreover, the manufacturing process of the counter substrate 40 according to the present embodiment can be carried out in the same way as in Embodiment 1, except that the black matrix 42 and the color filter layer 43 are not formed.

Embodiment 4

Still yet another embodiment of the present invention is described below. Here, only what is different from Embodiment 1 is described. The like members having the like configuration are labeled with the same reference numerals and their explanation is not repeated here.

A liquid crystal display device according to the present embodiment is identical with that of Embodiment 1 in terms of their structure. The liquid crystal display device according to the present embodiment is, however, different from that of Embodiment 1 in terms of a manufacturing process of an active matrix substrate 20.

The manufacturing process of the active matrix substrate 20 according to the present embodiment is described below, referring to (a) to (e) of FIG. 8.

Figure 8:
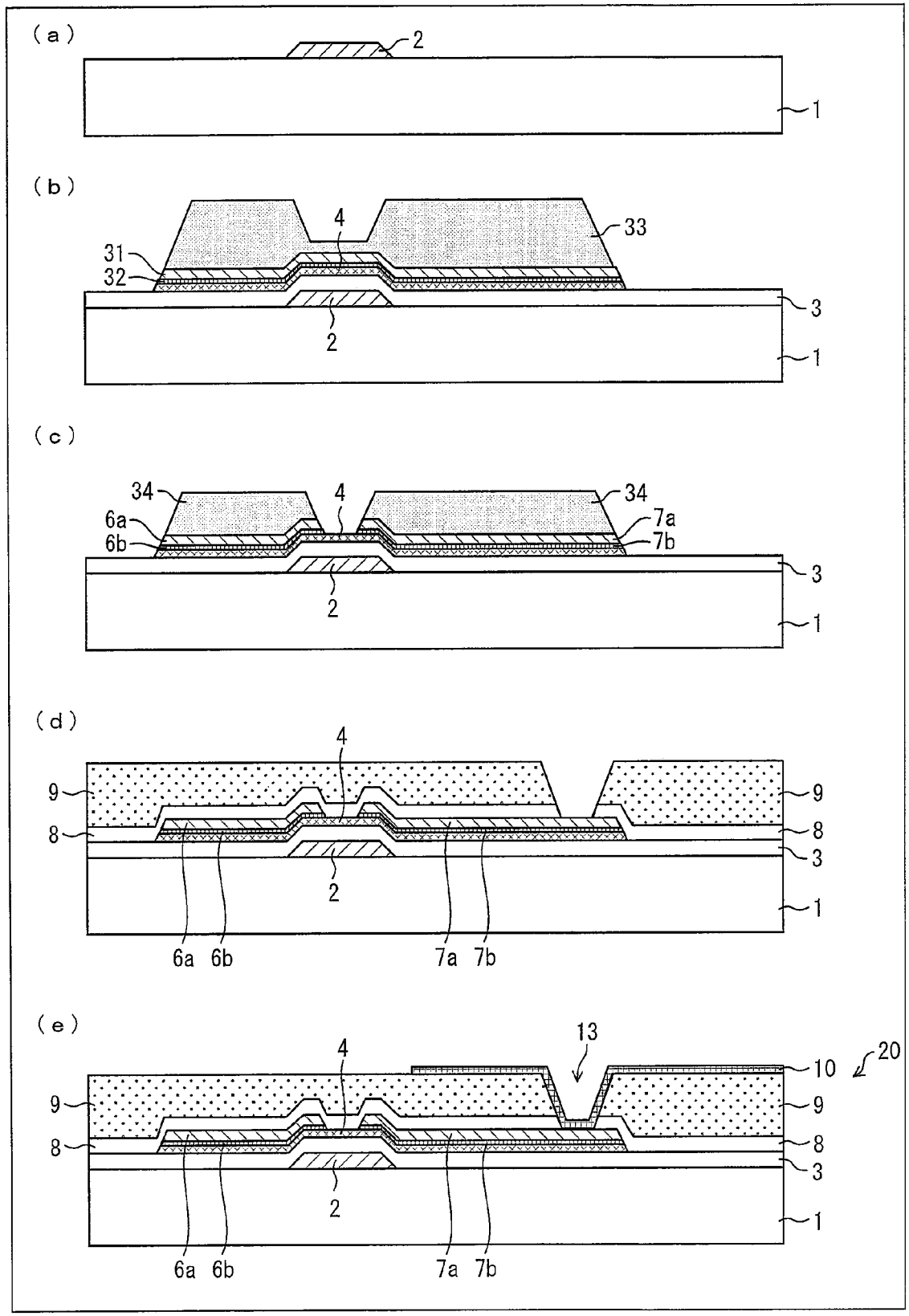
FIG. 8(a) to (e) of FIG. 8 are views illustrating a cross sectional structure after steps in a manufacturing process of an active matrix substrate according to yet another one embodiment of the present invention.

(a) to (e) of FIG. 8 are views illustrating a cross sectional structure after steps in a manufacturing process of an active matrix substrate according to yet another one embodiment of the present invention. The cross section illustrated in (a) to (e) of FIG. 8 is part of the active matrix substrate 20, which part is in the vicinity of the TFT 26. Here, the cross sectional structure and manufacturing process of the active matrix substrate 20 are described, referring to the vicinity of the TFT 26.

The manufacturing process of the active matrix substrate 20 according to the present embodiment is identical with that of Embodiment 1, except for (2) second step and (3) third step. Thus, only these steps are described below. That is, the first, fourth, and fifth steps are carried out in the same way as in Embodiment 1, and their explanation is not repeated here. The cross sectional structure after the first, fourth, and fifth steps is illustrated in (a), (d), and (e) of FIG. 8, respectively.

As in Embodiment 1, the manufacturing process is described based on the case where the signal electrode 6a and the drain electrode 7a are made from Cu. It should be noted that the manufacturing process of the present embodiment can manufacture the active matrix substrate in case where the signal electrode 6a and the drain electrode 7a are made from Al, Ag, an Al alloy, or the like material other than Cu.

(2) Second Step

In the second step, as illustrated in (b) of FIG. 8, an insulating layer 3, an oxide semiconductor layer 4, a Ti layer 32, and a Cu layer 31 are formed.

By a CVD method, a SiNx layer to be an insulating layer 3 is formed. By sputtering, an IGZO layer to be the oxide semiconductor layer 4, a Ti film to be the Ti layer 32, and a Cu film to be the Cu layer 31 are formed.

Next, a resist pattern 33 is formed by photolithography. The photolithography, which is carried out by half exposure technique, reduces a thickness of the resist pattern 33 partially at a part in which the Ti layer 32 layer and Cu layer 31 are to be removed in the third step later described. As a result the part becomes thinner than the other part of the resist pattern 33.

Next, after the Cu layer 31 is patterned by wet etching, the Ti layer 32 is patterned by dry etching. Then, the oxide semiconductor layer 4 is patterned by wet etching.

In this step, it is preferable that the SiNx layer is formed with a film thickness in a range of 200 nm to 500 nm, the IGZO layer is formed with a film thickness in a range of 30 nm to 300 nm, the Ti layer 32 is formed with a film thickness in a range of 30 nm to 100 nm, and a Cu layer 31 is formed with a film thickness in a range of 100 nm to 400 nm.

(3) Third Step

In the third step, as illustrated in (c) of FIG. 8, barrier layers 6b and 7b, a signal electrode 6a, and a drain electrode 7a are patterned.

The resist pattern 33 is subjected to ashing, so as to remove only the thinned part of the resist pattern 33, thereby forming a resist pattern 34 from the resist pattern 33. The ashing can be carried out by any method, and may be carried out by using plasma, or the like method, for example.

Next, the Cu layer 31 is etched by wet etching, and the Ti layer 32 is etched by dry etching. By this, the barrier layers 6b and 7b, the signal electrode 6a, and the drain electrode 7a are formed with their respective patterns.

Next, the resist patterned 34 is removed and washed away therefrom. Then, the fourth step and the fifth step are carried out in the same manner as in Embodiment 1. As a result, the active matrix substrate 20 is produced, as illustrated in (e) of FIG. 8.

According to the manufacturing process as described above, the active matrix substrate 20 can be manufactured by using four photo masks.

Embodiment 5

Yet still another embodiment according to the present invention is described below. Here, only what is different from Embodiment 1 is described. The like members having the like configuration are labeled with the same reference numerals and their explanation is not repeated here.

A liquid crystal display device according to the present embodiment is identical with that of Embodiment 1 in terms of their structures. The liquid crystal display device according to the present embodiment is, however, different from that of Embodiment 1 in terms of a manufacturing process of an active matrix substrate 20.

The manufacturing process of the active matrix substrate 20 according to the present embodiment is described below, referring to (a) to (e) of FIG. 9.

Figure 9:
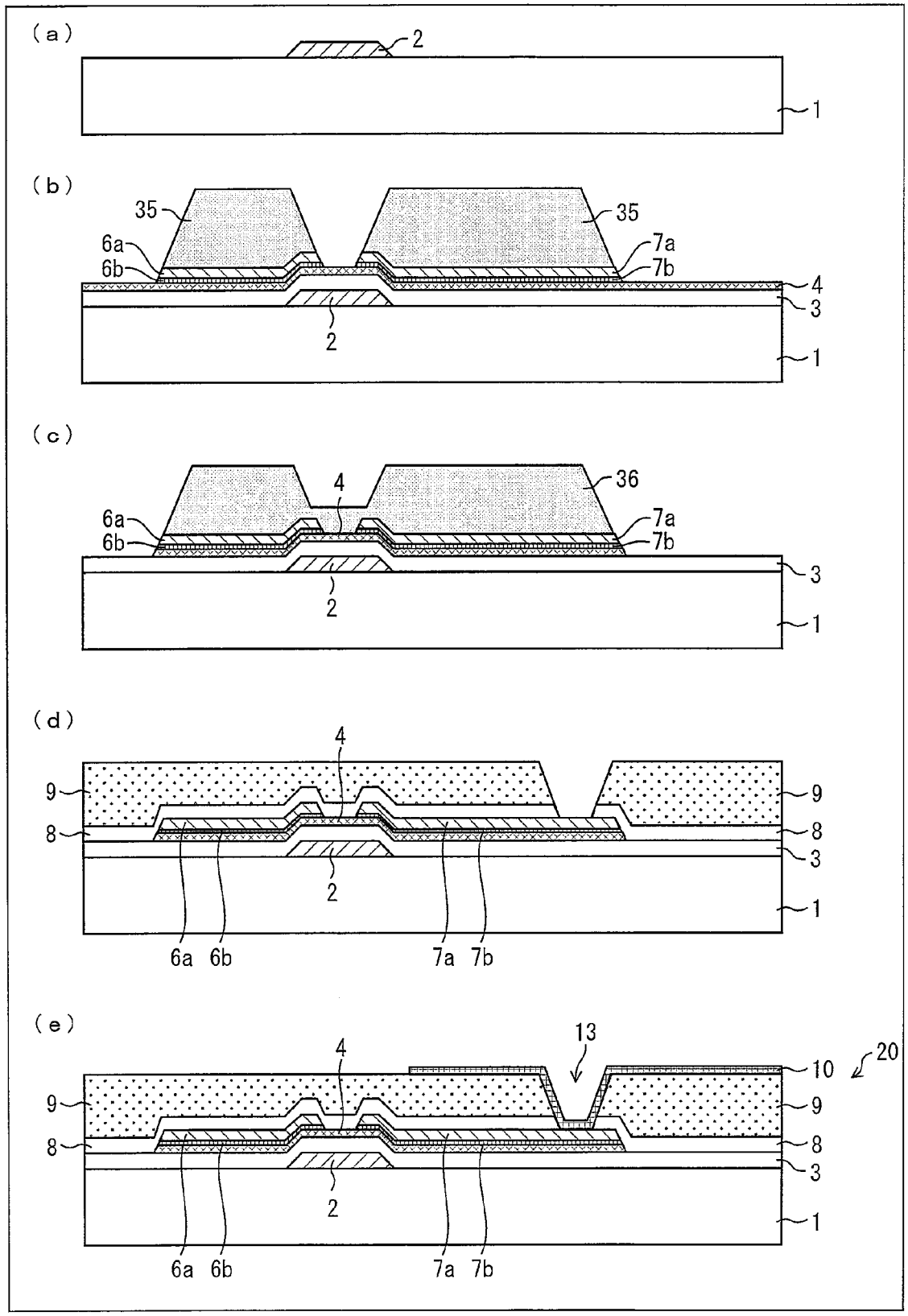
FIG. 9(a) to (e) of FIG. 9 are views illustrating a cross sectional structure after steps in a manufacturing process of an active matrix substrate according to still yet another one embodiment of the present invention.

(a) to (e) of FIG. 9 are views illustrating a cross sectional structure after steps in a manufacturing process of an active matrix substrate according to yet another one embodiment of the present invention. The cross section illustrated in (a) to (e) of FIG. 9 is part of the active matrix substrate 20, which part is in the vicinity of the TFT 26. Here, the cross sectional structure and manufacturing process of the active matrix substrate 20 are described, referring to the vicinity of the TFT 26.

The manufacturing process of the active matrix substrate 20 according to the present embodiment is identical with that of Embodiment 1, except for (2) second step and (3) third step. Thus, only these steps are described below. That is, the first, fourth, and fifth steps are carried out in the same way as in Embodiment 1, and their explanation is not repeated here. The cross sectional structure after the first, fourth, and fifth steps is illustrated in (a), (d), and (e) of FIG. 9, respectively.

As in Embodiment 1, the manufacturing process is described based on the case where the signal electrode 6a and the drain electrode 7a are made from Cu. It should be noted that the manufacturing process of the present embodiment can manufacture the active matrix substrate in case where the signal electrode 6a and the drain electrode 7a are made from Al, Ag, an Al alloy, or the like material other than Cu.

In the second step, as illustrated in (b) of FIG. 9, an insulating layer 3, an oxide semiconductor layer 4, a barrier layers 6b and 7b, a signal electrode 6a and a drain electrode 7a are formed.

By a CVD method, a SiNx layer to be the insulating layer 3 is formed. Then, by sputtering, an IGZO layer to be the oxide semiconductor layer 4, a Ti film to be the barrier layers 6b and 7b, and a Cu film to be the signal electrode 6a and drain electrode 7a are formed.

Then, a resist pattern 35 is formed by photolithography.

Next, by wet etching, the Cu film is etched. Then, the Ti film is etched by dry etching. By this, the barrier layers 6b and 7b, the signal electrode 6a, and drain electrode 7a are formed with their respective patterns.

In this step, it is preferable that the SiNx layer is formed with a film thickness in a range of 200 nm to 500 nm, the IGZO layer is formed with a film thickness in a range of 30 nm to 300 nm, the Ti layer is formed in a range of 30 nm to 100 nm, and the Cu layer 31 is formed with a film thickness in a range of 100 nm to 400 nm. However, the present invention is not limited to these film thicknesses.

(3) Third Step

In the third step, as illustrated in (c) of FIG. 9, the oxide semiconductor layer 4 is patterned.

A resist pattern 35 is thermally reflowed to be converted into a resist pattern 36. By this, the oxide semiconductor layer 4, which is exposed between the signal electrode 6a and the drain electrode 7a, is protected between the signal electrode 6a and the drain electrode 7a. The reflowing of the resist pattern 35 may be carried out by a method other than the thermal method. For example, the reflowing of the resist pattern 35 may be carried out by solvent environment or the like, for example.

Next, by wet etching, the oxide semiconductor layer 4 is patterned.

In this step, the above method makes it possible to remove away an unnecessary portion of the oxide semiconductor, while leaving the oxide semiconductor layer 4 between the signal electrode 6a and the drain electrode 7a.

Next, the resist pattern 36 is removed and washed away therefrom. The, the fourth step and the fifth step are carried out in the same manner as in Embodiment 1. As a result, the active matrix substrate 20 is produced as illustrated in (e) of FIG. 9.

According to the manufacturing process as described above, the active matrix substrate 20 can be manufactured by using four photo masks.

The method described in the present embodiment can produce a better liquid crystal display device, compared with the method of Embodiment 4, because of the following reasons.

Figure 10:
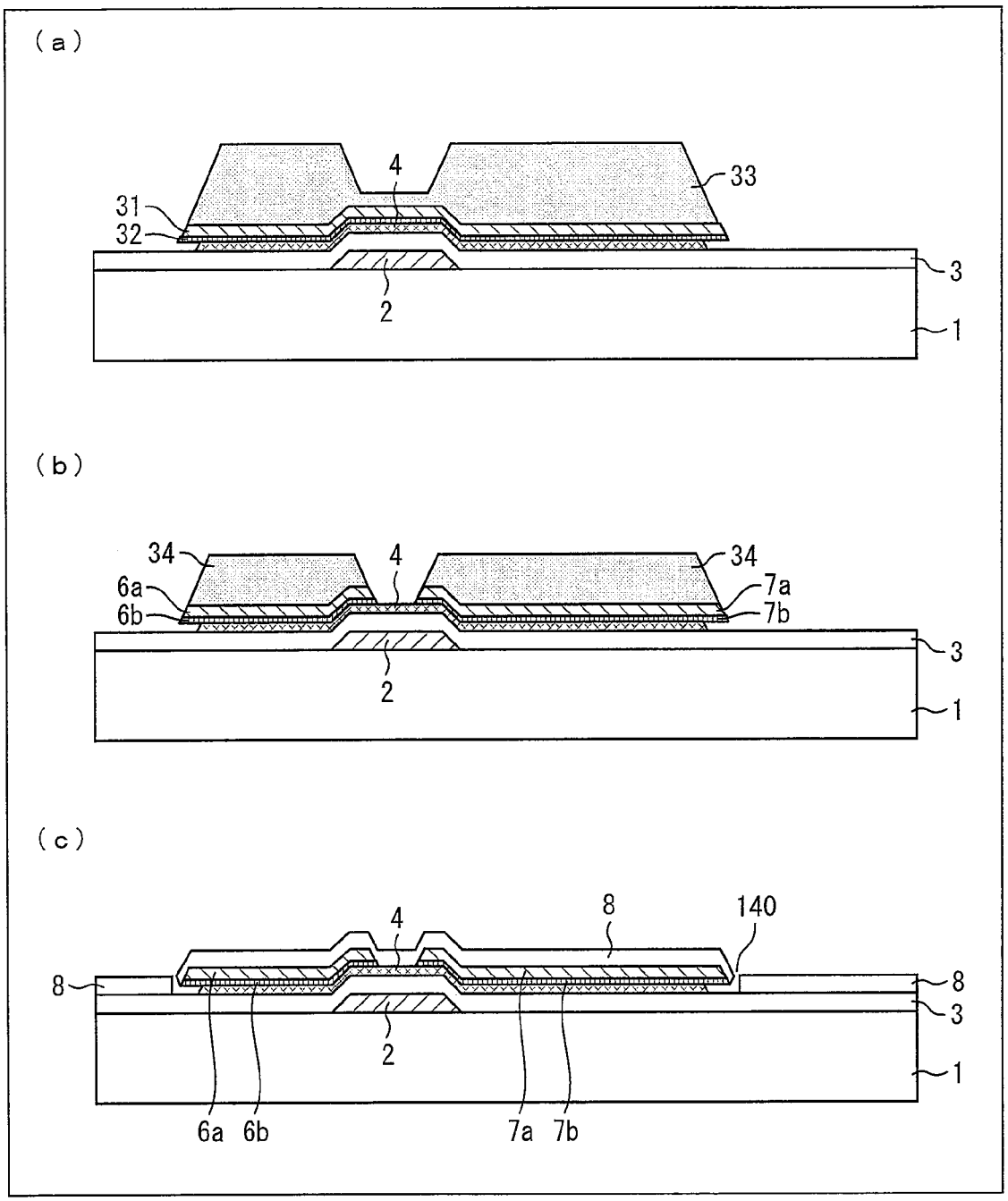
FIG. 10(a) to (c) of FIG. 10 are views illustrating a cross sectional structure after steps in part of a manufacturing process of an active matrix substrate according to Embodiment 4 of the present invention.

(a) to (c) of FIG. 10 are views illustrating a cross sectional structure after steps in part of a manufacturing process of the active matrix substrate 20 according to Embodiment 4 of the present invention. (a) of FIG. 10 illustrates a cross sectional structure after the end of the second step. (b) of FIG. 10 illustrates the cross sectional structure after the end of the third step. (c) of FIG. 10 illustrates the cross sectional structure after the end of the fourth step in which the protection layer 8 is formed.

In Embodiment 4, as illustrated in (a) of FIG. 10, after the patterning of the Cu layer 31 and the Ti layer 32, the second step performs the wet etching of IGZO to be the oxide semiconductor layer 4. In the wet etching, as illustrated in FIG. 10, there is a risk that the IGZO is etched to have a narrower width than those of the Cu layer 31 and the Ti layer 32. In such a case, as illustrated in (c) of FIG. 10, the protect layer 8 would fail to sufficiently cover the oxide semiconductor layer 4, the signal electrode 6a, the drain electrode 7a, and the barrier layers 6b and 7b. This would result in defective coverage 140 of the protection layer 8, thereby leading to problems such as deterioration of TFT properties, corrosion of Cu, Al alloy, etc. in the electrodes.

Figure 11:
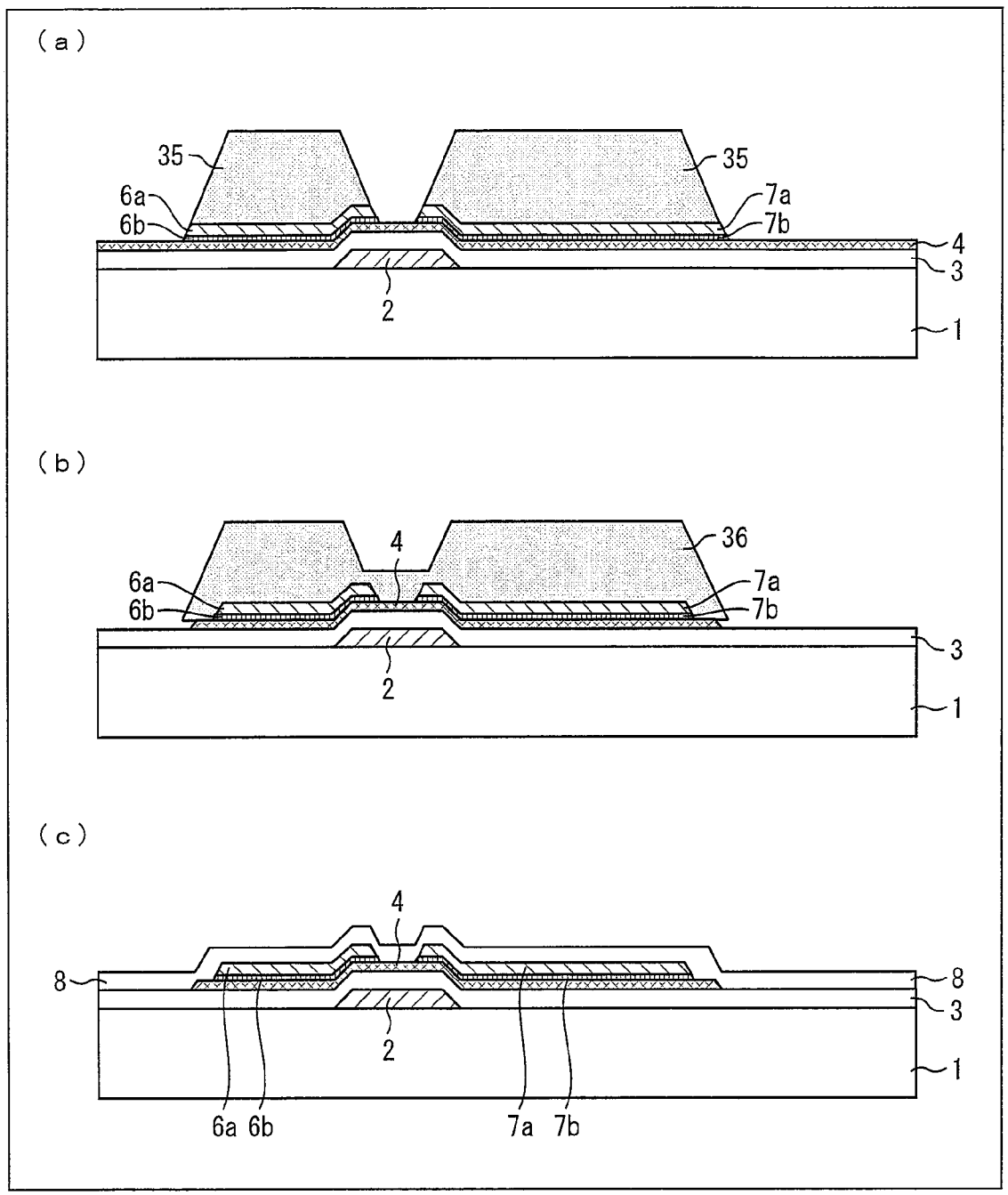
FIG. 11(a) to (c) of FIG. 11 are views illustrating a cross sectional structure after steps in part of a manufacturing process of an active matrix substrate according to Embodiment 5 of the present invention.

(a) to (c) of FIG. 11 are views illustrating a cross sectional structure after steps in part of a manufacturing process of the active matrix substrate 20 according to Embodiment 5 of the present invention. (a) of FIG. 11 illustrates a cross sectional structure after the end of the second step. (b) of FIG. 11 illustrates the cross sectional structure after the end of the third step. (c) of FIG. 11 illustrates the cross sectional structure after the end of the fourth step in which the protection layer 8 is formed.

As described above, in the present embodiment, as illustrated in (a) and (b) of FIG. 11, the resist pattern 35 is reflowed in the third step so as to be converted into the resist pattern 36 with a narrower resist width. The IGZO to be the oxide semiconductor layer 4 is etched in this state, thereby preventing the IGZO from being etched to have a width narrower than those of regions in which the signal electrode 6a, the drain electrode 7a, and the barrier layers 6b and 7b are formed, respectively.

Therefore, in the fourth step, the protection layer 8 can be formed to sufficiently cover the oxide semiconductor layer 4, the signal electrode 6a, the drain electrode 7a, and the barrier layers 6b and 7b, as illustrated in (c) of FIG. 11. This makes it possible to realize a TFT 26 with good property and reliability by preventing the TFT 26 from TFT property deterioration and corrosion of Cu, Al alloy or the like in the electrodes.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

For example, the thin film transistor according to the present invention is preferably configured such that the first electrode is made from Cu, Al, Ag, or an Al alloy.

With this configuration, the first electrode can have a smaller resistance, thereby providing the thin film transistor better properties.

Moreover, the thin film transistor according to the present invention is more preferably configured such that the first electrode is made from the Al alloy; and the Al alloy contains Al, Cu, and at least one selected from the group consisting of Co, Rh, Ni, Pd, C, Si, Ge, Sn, and La.

With this configuration, it is possible to prevent corrosion, for example, in case where the first electrode is formed as a film. Further, when a heat treatment is applied, hillock is prevented. Further, the first barrier layer makes it possible to form an ohmic contact between the Al alloy constituting the first electrode and the oxide semiconductor constituting the channel layer.

Moreover, the thin film transistor according to the present invention is preferably configured such that Cu content in the Al alloy is 0.1 wt % or more but 5.0 wt % or less.

With this configuration, because the Cu content in the Al alloy is 0.1 wt % or more, it becomes possible to prevent corrosion, for example, in case the first electrode is formed as a film, and to give the first electrode a smaller resistance. Moreover, because the Cu content in the Al alloy is 5.0 wt % or less, it becomes possible to prevent corrosion, for example, in case the first electrode is formed as a film.

Moreover, the thin film transistor according to the present invention is preferably configured such that the first barrier layer is made from Ti, Mo, a Ti alloy, or a Mo—Ti alloy.

With this configuration, the first barrier layer makes it possible to establish electric connection between the channel layer and the first electrode, efficiently.

Moreover, the thin film transistor according to the present invention is preferably configured by further comprising: a second barrier layer made from at least one selected from the group consisting of Ti, Mo, W, Nb, Ta, Cr, nitrides thereof, and alloys thereof, the second barrier layer being in touch with the second electrode and the channel layer and separating the second electrode from the channel layer.

With this configuration, the second barrier layer electrically connects the second electrode and the channel electrode while the second barrier layer separates the second electrode from the channel electrode. Thus, the second barrier prevents the second electrode and the channel electrode from being in direct touch with each other. Even if the second electrode is made from a metal (such as Cu) easily oxidized and converted into an oxide with oxygen in the oxide semiconductor constituting the channel layer, this configuration prevents the metal from being oxidized converted into an oxide with the oxygen in the oxide semiconductor. This prevents the oxide semiconductor from being converted into an N-type semiconductor by being deprived of oxygen thereof, and prevents the metal in the second electrode from being converted into an oxide, which is a P-type semiconductor. As a result, the thin film transistor can form and maintain an ohmic contact between the second electrode and the channel layer, thereby being a thin film transistor with good properties.

Moreover, the thin film transistor according to the present invention is preferably configured such that the second electrode is made from Cu, Al, Ag, or an Al alloy.

With this configuration, the second electrode can have a smaller resistance, thereby providing the thin film transistor better properties.

Moreover, the thin film transistor according to the present invention is preferably configured such that the second electrode is made from the Al alloy, and the Al alloy contains Al, Cu, and at least one selected from the group consisting of Co, Rh, Ni, Pd, C, Si, Ge, Sn, and La.

With this configuration, it is possible to prevent corrosion, for example, in case where the second electrode is formed as a film. Further, when a heat treatment is applied, hillock is prevented. Further, the first barrier layer makes it possible to form an ohmic contact between the Al alloy constituting the second electrode and the oxide semiconductor constituting the channel layer.

Moreover, the thin film transistor according to the present invention is preferably configured such that Cu content in the Al alloy is 0.1 wt % or more but 5.0 wt % or less.

With this configuration, because the Cu content in the Al alloy is 0.1 wt % or more, it becomes possible to prevent corrosion, for example, in case the second electrode is formed as a film, and to give the second electrode a smaller resistance. Moreover, because the Cu content in the Al alloy is 5.0 wt % or less, it becomes possible to prevent corrosion, for example, in case the second electrode is formed as a film.

Moreover, the thin film transistor according to the present invention is preferably configured such that the second barrier layer is made from Ti, Mo, a Ti alloy, or a Mo—Ti alloy.

With this configuration, the second barrier layer makes it possible to establish electric connection between the channel layer and the second electrode, efficiently.

Moreover, the thin film transistor according to the present invention is preferably configured such that the oxide semiconductor contains at least one selected from the group consisting of In, Ga, Al, Si, Sn, Cu, and Zn.

With this configuration, the thin film transistor can attain further better properties.

An active matrix substrate according to the present invention comprises any one of the thin film transistors described above. Hence, the active matrix substrate is provided with such a thin film transistor having good property by being capable of forming and maintaining an ohmic contact between the channel layer and the electrode.

A display panel according to the present invention comprises the active matrix substrate.

A display device according to the present invention comprises the display panel.

In these configurations, such an active matrix substrate is provided, that comprises a thin film transistor capable of forming and maintaining an ohmic contact between the channel layer and the electrode. Thus, with these configurations, the display panel can have a large size, high resolution, and an ability of high-speed driving, and the display device can be a display device provided the display panel.

It is to be understood that the embodiments and examples described above are not intended to be exhaustive nor limiting of the invention, but, on the contrary, are give for purposes of illustration in order that others skilled in the art may fully understand the technical contents of the invention, and that the present invention Such variations are not to be regarded as a departure from the spirit and scope of the invention, and all such modifications as would be obvious to one skilled in the art are intended to be included within the scope of the following claims.

INDUSTRIAL APPLICABILITY

The present invention can provide a thin film transistor with good property by being capable of forming and maintaining an ohmic contact between the channel layer and the electrode. Thus, the present invention is suitably applicable to various types of display devices and the like provided with thin film transistors.

REFERENCE SIGNS LIST

1: Glass
2: Scanning Electrode
3: Insulating Layer
4: Oxide Semiconductor (Channel Layer)
6a: Signal Electrode (First Electrode)
6b: Barrier layer (First Barrier Layer)
7a: Drain Electrode (Second Electrode)
7b: Barrier Layer (Second Barrier Layer)
8: Protection Layer
9: Interlayer Insulating Layer
10: Pixel Electrode
11: Black Matrix
12: Color Filter Layer
20: Active Matrix Substrate
26: TFT (Thin Film Transistor)

The invention claimed is:

1. A thin film transistor comprising:
   a channel layer arranged to electrically connect a first electrode and a second electrode, the channel layer being made from an oxide semiconductor;
   a protection layer provided directly on an upper surface of the first electrode and an upper surface of the second electrode, the protection layer also being in direct contact with an upper surface of the channel layer;
   an insulating layer provided directly on an upper surface of the protection layer;
   a pixel electrode provided directly on an upper surface of the insulating layer; and
   a first barrier layer made from at least one selected from the group consisting of Ti, Mo, W, Nb, Ta, Cr, nitrides thereof, and alloys thereof, wherein
   the first barrier layer is in contact with the first electrode and the channel layer and is arranged to separate the first electrode from the channel layer;
   the pixel electrode is in direct contact with the upper surface of the second electrode through contact holes provided within the protection layer and the insulating layer; and
   a lateral edge of the first barrier layer is arranged inward from a lateral edge of the channel layer, the lateral edge of the channel layer being directly covered by the protection layer.

2. The thin film transistor as set forth in claim 1, wherein the first electrode is made from Cu, Al, Ag, or an Al alloy.

3. The thin film transistor as set forth in claim 2, wherein:
   the first electrode is made from the Al alloy; and
   the Al alloy contains Al, Cu, and at least one selected from the group consisting of Co, Rh, Ni, Pd, C, Si, Ge, Sn, and La.

4. The thin film transistor as set forth in claim 3, wherein Cu content in the Al alloy is 0.1 wt % or more but 5.0 wt % or less.

5. The thin film transistor as set forth in claim 1, wherein the first barrier layer is made from Ti, Mo, a Ti alloy, or a Mo—Ti alloy.

6. The thin film transistor as set forth in claim 1, further comprising:
   a second barrier layer made from at least one selected from the group consisting of Ti, Mo, W, Nb, Ta, Cr, nitrides thereof, and alloys thereof,
   the second barrier layer being in touch with the second electrode and the channel layer and separating the second electrode from the channel layer.

7. The thin film transistor as set forth in claim 6, wherein the second electrode is made from Cu, Al, Ag, or an Al alloy.

8. The thin film transistor as set forth in claim 7, wherein:
   the second electrode is made from the Al alloy; and
   the Al alloy contains Al, Cu, and at least one selected from the group consisting of Co, Rh, Ni, Pd, C, Si, Ge, Sn, and La.

9. The thin film transistor as set forth in claim 8, wherein Cu content in the Al alloy is 0.1 wt % or more but 5.0 wt % or less.

10. The thin film transistor as set forth in claim 6, wherein the second barrier layer is made from Ti, Mo, a Ti alloy, or a Mo—Ti alloy.

11. The thin film transistor as set forth in claim 1, wherein the oxide semiconductor contains at least one selected from the group consisting of In, Ga, Al, Si, Sn, Cu, and Zn.

12. An active matrix substrate comprising a thin film transistor as set forth in claim 1.

13. A display panel comprising an active matrix substrate as set forth in claim 12.

14. A display device comprising a display panel as set forth in claim 13.

15. A method for manufacturing a thin film transistor including a channel layer arranged to electrically connect a first electrode and a second electrode, the channel layer being made from an oxide semiconductor, the method comprising:
   a channel layer forming step for forming the channel layer on a substrate;
   a barrier layer forming step for forming, on the channel layer, a first barrier layer made from at least one selected from the group consisting of Ti, Mo, W, Nb, Ta, Cr, nitrides thereof, and alloys thereof;
   an electrode forming step for depositing the first electrode on the first barrier layer;
   a protection layer forming step for forming, directly on an upper surface of the first electrode and an upper surface of the second electrode, a protection layer, the protection layer also being in direct contact with an upper surface of the channel layer;

an insulating layer forming step for forming, directly on an upper surface of the protection layer, an insulating layer; and a pixel electrode forming step for forming, directly on an upper surface of the insulating layer, a pixel electrode, wherein the first barrier layer is in contact with the first electrode and the channel layer and is arranged to separate the first electrode from the channel layer;

the pixel electrode is in direct contact with the upper surface of the second electrode through contact holes provided within the protection layer and the insulating layer;

the barrier layer forming step further includes a barrier layer patterning step of patterning the barrier layer using a resist pattern to form a lateral edge of the barrier layer; and the channel layer forming step further includes a channel layer patterning step of patterning the channel layer using the resist pattern, which has been deformed by a thermal treatment, to form a lateral edge of the channel layer, the lateral edge of the channel layer is positioned outward from the lateral edge of the barrier layer.

16. The thin film transistor as set forth in claim 1, wherein the first barrier layer has a substantially same shape as that of the first electrode.

17. The thin film transistor as set forth in claim 6, wherein the first barrier layer has a substantially same shape as that of the first electrode, and the second barrier layer has a substantially same shape as that of the second electrode.

18. The thin film transistor as set forth in claim 6, wherein a lateral edge of the second barrier layer is arranged inward from another lateral edge of the channel layer which is directly covered by the protection layer.

* * * * *